United States Patent
Marzbanrad et al.

(10) Patent No.: US 11,655,388 B2
(45) Date of Patent: May 23, 2023

(54) METHODS FOR SYNTHESIZING METAL NANOSTRANDS, AND STRUCTURES FORMED OF THE METAL NANOSTRAND SYNTHESIZED THEREOF

(71) Applicant: Nano Cnet LTD., Waterloo (CA)

(72) Inventors: Ehsan Marzbanrad, Waterloo (CA); Hadi Hosseinzadeh Khaligh, Waterloo (CA)

(73) Assignee: Nano Cnet LTD., Waterloo (CA)

( * ) Notice: Subject to any disclaimer, the term of this patent is extended or adjusted under 35 U.S.C. 154(b) by 295 days.

(21) Appl. No.: 16/699,008

(22) Filed: Nov. 28, 2019

(65) Prior Publication Data
US 2020/0109306 A1 Apr. 9, 2020

Related U.S. Application Data

(63) Continuation of application No. PCT/CA2018/050652, filed on Jun. 1, 2018.

(60) Provisional application No. 62/667,659, filed on May 7, 2018, provisional application No. 62/514,638, filed on Jun. 2, 2017.

(51) Int. Cl.
| | |
|---|---|
| *C30B 29/64* | (2006.01) |
| *C09D 11/52* | (2014.01) |
| *C30B 7/14* | (2006.01) |
| *C30B 29/02* | (2006.01) |
| *C30B 29/60* | (2006.01) |
| *B82Y 30/00* | (2011.01) |
| *B82Y 40/00* | (2011.01) |

(52) U.S. Cl.
CPC ............... *C09D 11/52* (2013.01); *C30B 7/14* (2013.01); *C30B 29/02* (2013.01); *C30B 29/60* (2013.01); *B82Y 30/00* (2013.01); *B82Y 40/00* (2013.01)

(58) Field of Classification Search
CPC ......... C30B 29/00; C30B 29/10; C30B 29/60; C30B 29/64; B82Y 30/00; B82Y 40/00; C09D 11/52
See application file for complete search history.

(56) References Cited

U.S. PATENT DOCUMENTS

2016/0137865 A1 5/2016 Kwon et al.

OTHER PUBLICATIONS

Synthesis of Silver Nanoplates by Two-Dimensional Oriented Attachment, Liu et al., Langmuir 2012, 28, 9244-9249.*
A flexible conductive film prepared by the oriented stacking of Ag and Au/Ag alloy nanoplates and its chemically roughened surface for explosive SERS detection and cell adhesion, Sun et al, RSC Adv., 2017, 7, 7073-7078.*
Dendritic Silver Nanostructure Growth and Evolution in Replacement Reaction, Fang et al., Crystal Growth & Design, vol. 7, No. 5, 2007, pp. 864-867.*
Solvothermal synthesis and formation mechanism of chain-like triangular silver nanoplate assemblies: Application to metal-enhanced fluorescence (MEF), He et al., Applied Surface Science 255 (2009) 7361-7368.*
Patrick Mamputu, "International Search Report and the Written Opinion", issued in International Application No. PCT/CA2018/050652, dated Aug. 16, 2018. 12 pages.
Nanoplates, Swarnavalli et al. A Simple Approach to the Synthesis of Hexagonal-Shaped Silver, Journal of Nanomaterials, vol. 2011, Article ID 825637, 5 pages.
Xin et al. "Shape-controlled synthesis for silver: Triangular/hexagonal nanoplates, chain-like nanoplate assemblies, and nanobelts", Key Laboratory of Silicate Materials Science and Engineering, Wuhan University of Technology, Received Jan. 11, 2009.

* cited by examiner

*Primary Examiner* — Haidung D Nguyen

(57) ABSTRACT

Nanostructures formed of metal nanostrands, and methods of forming the nanostrands, are described. These nanostructures can be used as a flexible or non-flexible, transparent or non-transparent conductive films or electronic circuit for various different applications. An example metal nanostrand can include: a first nanoplate joined laterally to a second nanoplate. Each of the nanoplates can have a top surface, a bottom surface and one or more side surfaces laterally extending from the top surface to the bottom surface. A (111) crystallographic plane can be arranged at each of the top surface and the bottom surface.

21 Claims, 5 Drawing Sheets

METHODS FOR SYNTHESIZING METAL NANOSTRANDS, AND STRUCTURES FORMED OF THE METAL NANOSTRAND SYNTHESIZED THEREOF

CROSS-REFERENCE TO RELATED PATENT APPLICATIONS

This application is a continuation of International Application No. PCT/CA2018/050652 filed on Jun. 1, 2018, which claims the benefit of U.S. Provisional Patent Application No. 62/514,638 titled "Transparent Nanostructured Mesh of Metal Nanostrips" filed on Jun. 2, 2017 and U.S. Provisional Patent Application No. 62/667,659 titled "Methods for Synthesizing Metal Nanostrands, and Structures formed of the Metal Nanostrand Synthesized thereof" filed on May 7, 2018. The complete disclosure of each of International Application No. PCT/CA2018/050652, U.S. Provisional Patent Application No. 62/514,638 and U.S. Provisional Patent Application No. 62/667,659 is incorporated herein by reference.

FIELD

The described embodiments relate to methods for synthesizing metal nanostrands and structures formed of the metal nanostrands. The described metal nanostrands can be used in the fabrication of transparent and non-transparent, flexible and nonflexible conductive films, patterns and circuits, for example.

BACKGROUND

Conductive films are typically formed with a thin electrically conductive layer of material coated on a substrate. Conductive films are a crucial component of many electronic devices. They need to be electrically conductive, and in case of transparent conductive films, they must be optically transparent at the same time. Such thin films are widely used in today's electronics as flexible electronic devices, transparent electrodes, touch panels, displays, thin film photovoltaics and smart windows. Moreover, in some industries, such as automotive and aerospace, conductive coating has a wide range of application.

Traditionally, copper is the most common conductive material, which has been employed for fabricating electronic circuit boards for decays. Coating the copper by a thin layer of noble metals such as gold is also very popular to protect the conductive layer against corrosion and provide the best electrical conductivity at the same time. Progress in electronics brought a new demand for transparent conductors in various applications, such as touch panels, smart windows and displays. This demand was answered by a thin layer of Indium thin oxide (ITO), which has high transparency and electrical conductivity.

However, these conductive materials are not flexible and cannot be easily and cost-effectively produced on a large area, and cannot easily conform to various substrates.

SUMMARY

In some embodiments, nanostructures formed of metal nanostrands are described. These nanostructures can be used as a flexible or non-flexible, transparent or non-transparent conductive films or electronic circuit for various different applications.

In accordance with an embodiment, there is provided a metal nanostrand having: a first nanoplate joined laterally to a second nanoplate, wherein each of the nanoplates comprises a top surface, a bottom surface and one or more side surfaces laterally extending from the top surface to the bottom surface, and wherein a (111) crystallographic plane is arranged at each of the top surface and the bottom surface.

In some embodiments, the metal nanostrand has an axial length within a range from approximately 1 microns to approximately 1000 microns.

In some embodiments, the metal nanostrand has an axial width within a range from approximately 50 nanometers to approximately 200 nanometers.

In some embodiments, the metal nanostrand has a thickness within a range from approximately 10 nm to approximately 40 nm.

In some embodiments, the metal nanostrand has three or more nanoplates.

In some embodiments, the one or more nanoplates has a hexagonal shape and one or more nanoplates has a triangular shape.

In accordance with an embodiment, there is provided a nanostrand mesh formed of two or more metal nanostrands disclosed herein. The two or more metal nanostrands can overlap at least an adjacent metal nanostrand.

In some embodiments, the two or more metal nanostrands are randomly oriented with respect to each other.

In some embodiments, the two or more metal nanostrands are aligned along a target direction.

In some embodiments, the nanostrand mesh has a thickness of 100 nm or more, such as in a range of approximately 100 nm to 600 nm.

In accordance with an embodiment, there is provided a method of forming one or more metal nanostrands. The method includes mixing a metal salt, an additive, and deionized water to form a metal solution; mixing a reducing agent, a capping agent, and deionized water to form a reducing solution; and mixing the metal solution and the reducing solution to synthesize the one or more metal nanostrands.

In some embodiments, the metal salt includes silver salt.

In some embodiments, the additive includes sodium nitrate and nitric acid.

In some embodiments, the reducing agent includes ascorbic acid.

In some embodiments, the capping agent is selected from the group consisting of: PMA, PMAA, PMMA and PVP.

In some embodiments, the size of the nanostrands can be controlled by adding chemicals after starting the synthesis to terminate the growth process.

In some embodiments, the method described herein includes applying a purification process to the one or more metal nanostrands.

In some embodiments, the purification process includes a centrifuge and sedimentation process.

In some embodiments, the method described herein includes infusing the one or more metal nanostrands into an ink, paste or other liquid media.

In some embodiments, the method described herein includes depositing the one or more metal nanostrands at a surface of a target substrate to form a conductive film.

In some embodiments, the method described herein includes post-processing the conductive film to fuse one or more junctions formed by one or more overlapping metal nanostrands.

In accordance with an embodiment, there is provided a metal nanostrand formed from any of the methods disclosed herein.

BRIEF DESCRIPTION OF THE DRAWINGS

Several embodiments will now be described in detail with reference to the drawings, in which.

DESCRIPTION OF VARIOUS EMBODIMENTS

Figure 1:
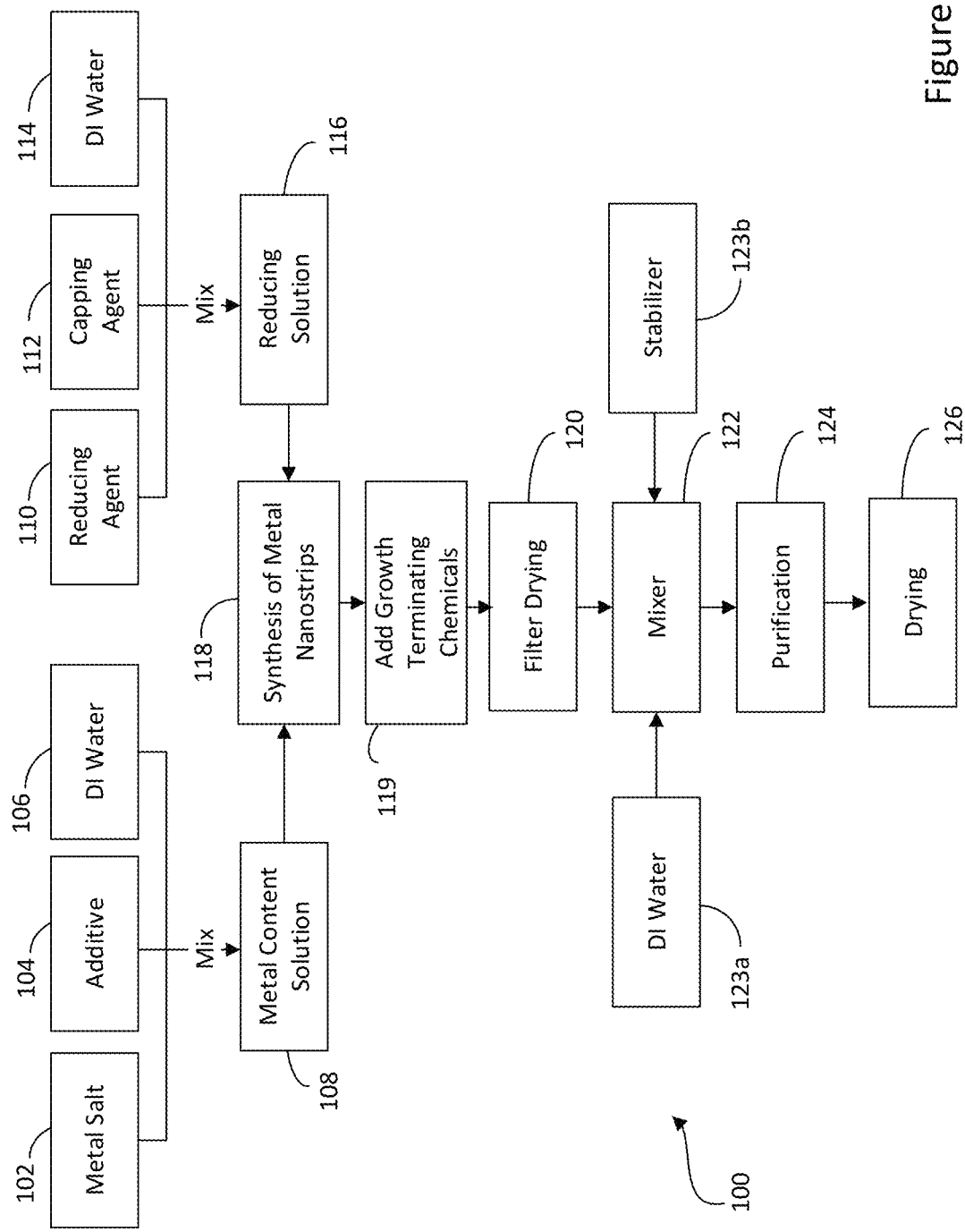
FIG. 1 is a flow diagram of an example method for synthesizing metal nanostrands.

In recent years, progress of the technology toward internet-of-the-things brings an increasing demand for flexible electronic circuits. Printing techniques such as screen printing has been developed for fabrication of electronic circuits on flexible substrates. Since then, the ink or paste development for printed electronic industry has gained prominence. The most common material which has been purposed for conductive ink\paste is silver. Silver flak and silver nanoparticles are the most common form of the conductive filler have been employed for conductive ink/paste manufacturing due to silver's properties such as high electrical conductivity, relatively low cost, and acceptable corrosion resistance.

In parallel, because of brittleness and high cost of Indium thin oxide (ITO), there is an increasing need for the replacement of Indium thin oxide within at least the transparent electrodes industry. Example materials for replacing Indium thin oxide includes, but is not limited to, silver nanowire, carbon nanotubes, graphene, and conductive polymers. The transparent conductive films from these materials have been fabricated and tested for printed and flexible electronics.

Silver nanowires can be used for producing transparent electrodes due, at least, to their high electrical conductivity, capability for making a mesh to provide electrical conductivity and transparency, and mechanical flexibility. However, the silver nanowire synthesis is a long, expensive, and low yield process. In addition, stability of the silver nanowire can be disadvantageous. Silver can interact with sulfur and chloride to create salts and hence, the silver nanowires can be unstable in ambient environment. Therefore, a protective layer is often required to isolate the silver nanoparticles and provide proper functionality.

Carbon nanotubes are another option for making transparent electrodes. Carbon nanotube is a cylindrical-shaped material that can be used to produce transparent conductive films with high optoelectrical performance. However, carbon nanotubes have poor transparency when applied in a mesh network form. In addition, carbon nanotubes have lower lifetime and are not cost effective for mass production of transparent conductive films.

Another example material that can replace Indium thin oxide includes Graphene nanocomposites. Graphene nanocomposites, however, is expensive and energy intensive to manufacture in large-quantities, often incorporating other rare earths to enhance specific electro-physical qualities. Therefore, graphene nanocomposites are not cost-effective for industry and end-users in the foreseeable future.

Conductive polymers have also been used as transparent electrodes for many new electronics. However, the optical absorption of conductive polymers is higher, and optical conductivity is lower than Indium thin oxide. Conductive polymers also suffer from long-term stability difficulties.

The nanostructures described herein can act as conductive material that is adaptable to flexible substrates. The described nanostructures can be manufactured with a fairly simple procedure that is also associated with a low overall cost for mass production.

Referring now to FIG. 1, illustrated therein is a flow diagram of an example method 100 for synthesizing metal nanostrands. The method 100 involves making a metal content solution 108 and a reducing solution 116, and mixing the solutions 108, 116 to synthesize the metal nanostrands 118.

The metal content solution 108 can include a mixture of a metal salt 102, an additive 104, and deionized (DI) water 106. While any suitable metal salt 102 may be selected, the metal salt may include, for example, silver salt. The additive 104 is incorporated into the metal content solution 108 to control the dissolution of the metal salt 102. Additive 104 may comprise, for example, sodium nitrate and nitric acid.

The molar ratio of the additive 104 to the metal salt 102 can affect at least the geometry, and size distribution, of the synthesized metal nanostrands. In some embodiments, the molar ratio can be in a range of 0 to 2.

Reducing solution 116 comprises a mixture of a reducing agent 110, a capping agent 112, and DI water 114. The reducing agent 110 may be, for example, ascorbic acid.

The capping agent 112 can help in synthesizing more uniform metal nanostrands. Any suitable capping agent 112 may be selected. For example, the capping agent 112 may be selected from any one of, but not limited to: polymethacrylic acid (PMA), poly(methymethacrylic acid) (PMAA), or polyvinylpyrrolidone (PVP) or Poly(methyl methacrylate) (PMMA). The reducing solution 116 can have a controlled pH that may be between 0 to 7. The molar ratio of the capping agent 112 to reducing agent 110 may be in a range between 0.0001 to 2. This range of molar ratio can affect the geometry, and size distribution, of the synthesized metal nanostrands.

The metal content solution 108 and reducing solution 116 are then combined together to synthesize the metal nanostrands 118. The solutions may be combined together, for example, in a synthesis reactor. In some embodiments, synthesis 118 may involve mixing the two solutions 108, 116 with minimal, or no, further energy input. For example, the combined solutions may be synthesized at room temperature (0° C. to 95° C.) in a water-based reaction. Synthesizing the nanostrands at room temperature can help reduce the energy required.

The shape and yield of the synthesized metal nanostrands can vary with, at least, the ratio of chemicals in the solutions 108, 116, the pH of the solutions 108, 116, as well as the temperature parameters under which synthesis 118 is carried out.

In some embodiments, the size of the nanostrands can be controlled by adding chemicals which stop the growth process. For example, after combining the metal content solution and reducing solution in a synthesis reactor (e.g., at 118), and waiting for a predetermined synthesis time period, such as between 10 second to 2 minutes depending on the type of materials and/or intended use of the nanostrands, for the nanostrands to grow, growth terminating chemicals may be added to the synthesis reactor at 119 to stop the nanostrand growth process. The growth terminating chemicals may cover the edges of the nanostrands to eliminate further assembly and joining thereof. For example, adding some form of a reducing and capping agent, such as Sodium citrate may reduce remaining silver ions to silver nanoparticles while also covering the surface of silver nanostrands and providing proper capping to terminate the growth process. The reducing and capping agent can be characterized by a strong reducing agent and small capping agent. The reducing or capping agent may reduce the quantity of silver ions in a synthesized solution of nanostrands and abate the synthesis of silver nanoparticles.

The synthesized metal nanostrands may be filter dried at 120. At 122, the metal nanostrands may be mixed with DI water 123a and a stabilizer 123b. For example, the stabilizer 123b may be polyvinylpyrrolidone (PVP), Polyethylene Furanoate (PEF), or polyethylene glycol (PEG), or sodium citrate. Another method can involve adjusting the pH by adding certain pH controlling additive or buffer agents to control the pH level to be between 5 to 14. For example, ammonium hydroxide can be added to control the pH level to be at 9 in order to stabilize the nanostrand in the solution. The filter drying 120 and mixing 122 can help remove reaction products, and extra capping agent, from the synthesis solution.

To extract irregularly shaped particles, big agglomerates, or small nanoparticles, which may have been generated during the synthesis 118, the synthesized product may be subject to a purification process 124. Any suitable purification process may be employed. By way of an example, the purification process may include a combined centrifuge and sedimentation process which separates the metal nanostrands by mass from undesired products.

The synthesized metal nanostrands may then be dried at 126 to complete the method 100. Drying the nanostrands can assist with the transfer of the nanostrands to a non-aqueous ink.

It will be understood by those of ordinary skill that although the method 100 has been described in a certain order, certain steps of method 100 may be configured to work in a different order where appropriate. In other words, some steps may be performed non-simultaneously despite being described or implied as occurring simultaneously. For example, metal content solution 108 and reducing solution 116 may be produced at different times from one another. The method 100 is not limited to the illustrated example shown in FIG. 1.

Figure 2A:
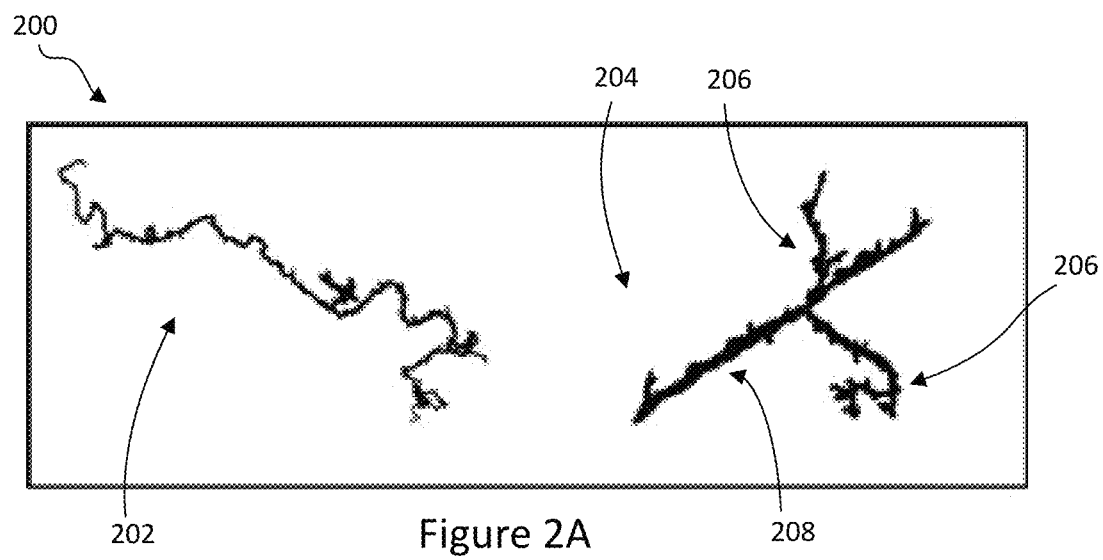
FIG. 2A is an enlarged view of example one dimensional nanostrands.
Figure 2B:
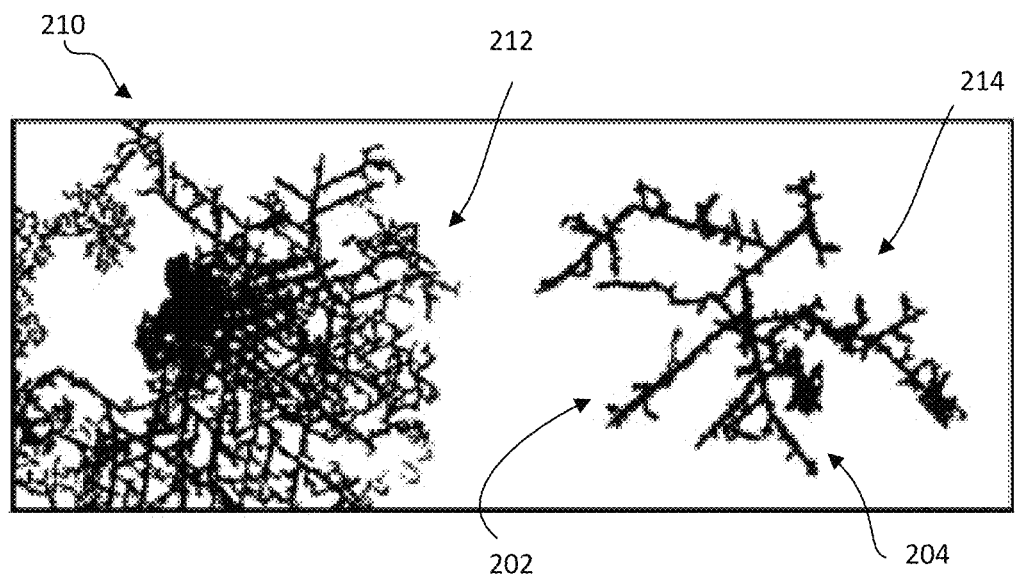
FIG. 2B is an enlarged view of example two-dimensional nanostrand meshes formed by joining one dimensional nanostrands.

Referring now to FIGS. 2A and 2B, shown herein are exemplary one-dimensional metal nanostrands 200 and two-dimensional metal nanostrand mesh network 210 resulting from method 100.

In particular, FIG. 2A shows a schematic of linear, or one-dimensional, metal nanostrands 202 and 204. One-dimension nanostrands 202, 204 may be characterized with an axial length that is substantially greater than the axial width. The terms "axial length" and "axial width" are defined in further detail below with reference to FIG. 3.

The one-dimensional nanostrands may also include one or more "branches" 206 extending away from a main trunk 208. The formation of branches 206 may result, for example, from varying at least one of the molar ratio of the chemicals in the metal content solution 108 and the reducing solution 116, the pH of the solutions 108, 116, or the temperature of synthesis 118. In some embodiments, the metal nanostrand can be manufactured with minimal branches. Minimizing the number of branches can improve performance in device applications. For example, minimizing the number of branches can increase a porosity of the nanostrand, which can increase its transparency.

FIG. 2B shows two-dimensional mesh networks 210, 214 generated from the method 100. The two-dimensional mesh networks 210 include multiple one-dimensional nanostrands welded together. Mesh network 214, as shown in FIG. 2B, can also include one-dimensional metal nanostrands 202 welded to branched nanostrands 204.

Figure 3A:
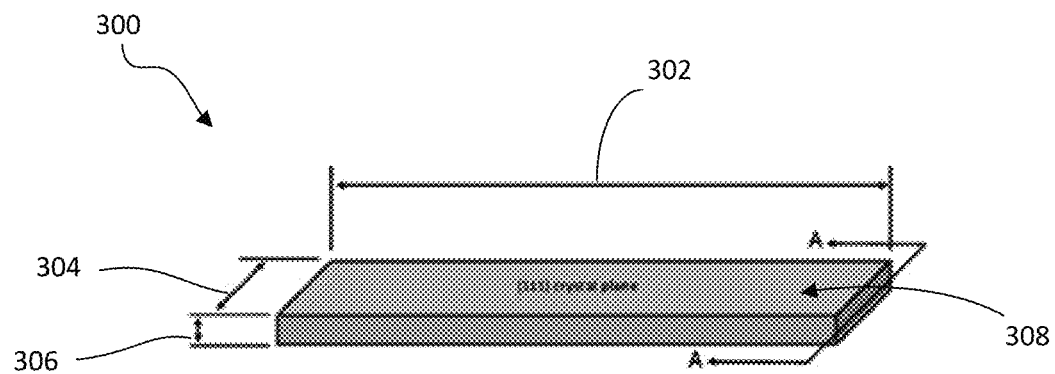
FIG. 3A is a schematic representation showing a perspective view of an example one-dimensional nanostrand segment.

FIG. 3A shows an example one-dimensional metal nanostrand 300. The one-dimensional metal nanostrands 300 disclosed herein can be characterized by an axial length 302, a lateral width 304, and a thickness 306.

For example, the metal nanostrand 300 of FIG. 3A extends along a strand axis with an axial length 302. An example range of the axial length can be between 10 μm to 1000 μm. The lateral width 304 of the metal nanostrand can be in the range of between 50 nm to 500 nm and the thickness 306 can be in the range between 10 nm to 100 nm.

In some embodiments, the metal nanostrand 300 can have an axial length 302 of at least 1 μm. An axial length in this range can help facilitate at least partial overlapping of adjacent ones of the metal nanostrands when they are deposited on a substrate to form a mesh network.

Figure 3B:
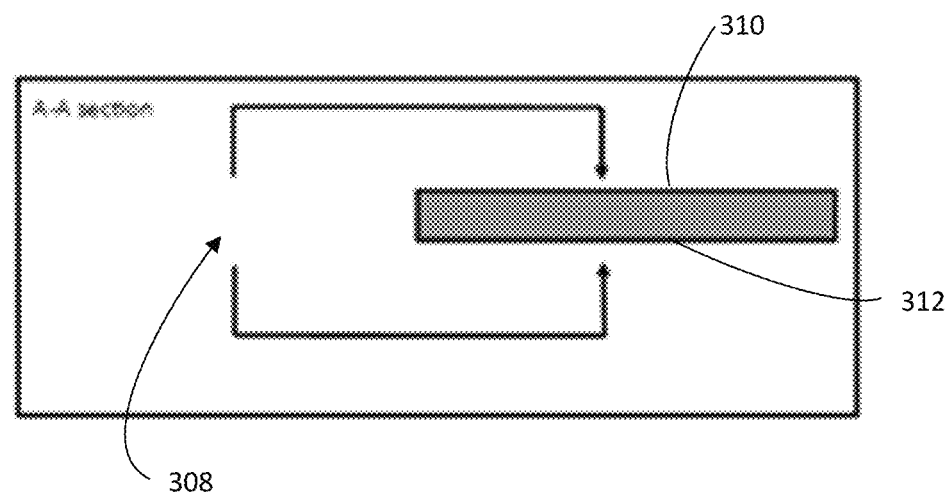
FIG. 3B is a cross-sectional schematic of the one-dimensional nanostrand segment of FIG. 3A taken along section line A-A.

FIG. 3B shows a cross-section of the metal nanostrand 300 of FIG. 3A along sectional line A-A. As shown generally, (111) crystallographic planes 308 are arranged at the top surface 310 and bottom surface 312 of the metal nanostrand 300. The (111) crystallographic planes 308 can naturally form on the top and bottom surfaces during synthesis 118 of method 100.

The (111) crystallographic planes 308 can offer high stability for the nanostrands 300 when the nanostrands 300 are subjected to various stress, such as, but not limited to, chemical, thermal, and electrical stress, because of how the low energy (111) planes are oriented on the top 310 and bottom 312 surfaces. The capping agent 112, which may be introduced into metal content solution 108, can help cover/coat the (111) planes to further stabilize the metal nanostrand.

While the one-dimensional metal nanostrands 200 and 300 have herein so far been illustrated schematically as being generally rectangular prisms, the metal nanostrands 200, 300 can be of different configurations and shapes. The shape and configuration of the nanostrands 200, 300 may depend on various factors, such as but not limited to, the molar ratio of the chemicals in metal content solution 108 and reducing solution 116, the pH of the solutions 108, 116, or the temperature of synthesis 118.

Figure 4A:
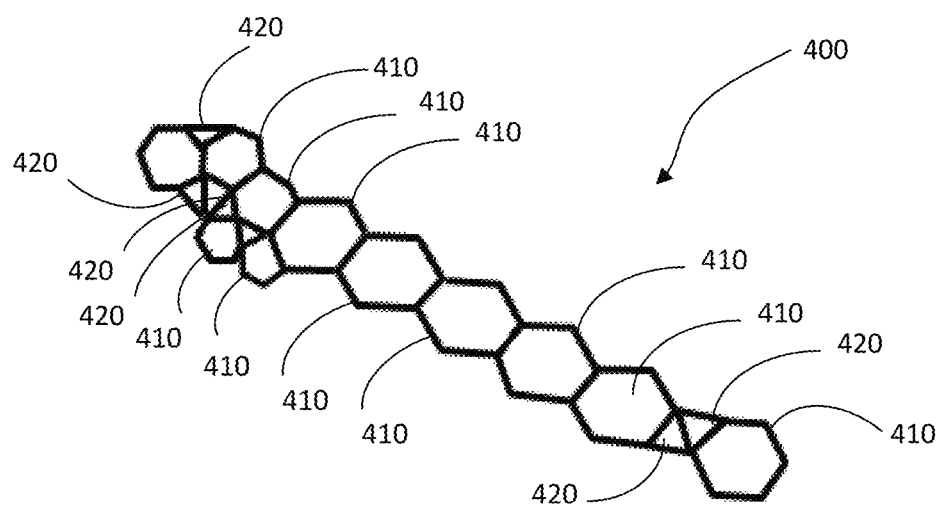
FIG. 4A is a schematic representation of example nanoplates formed in a nanostrand segment in accordance with an example embodiment.
Figures 4B, 4C:
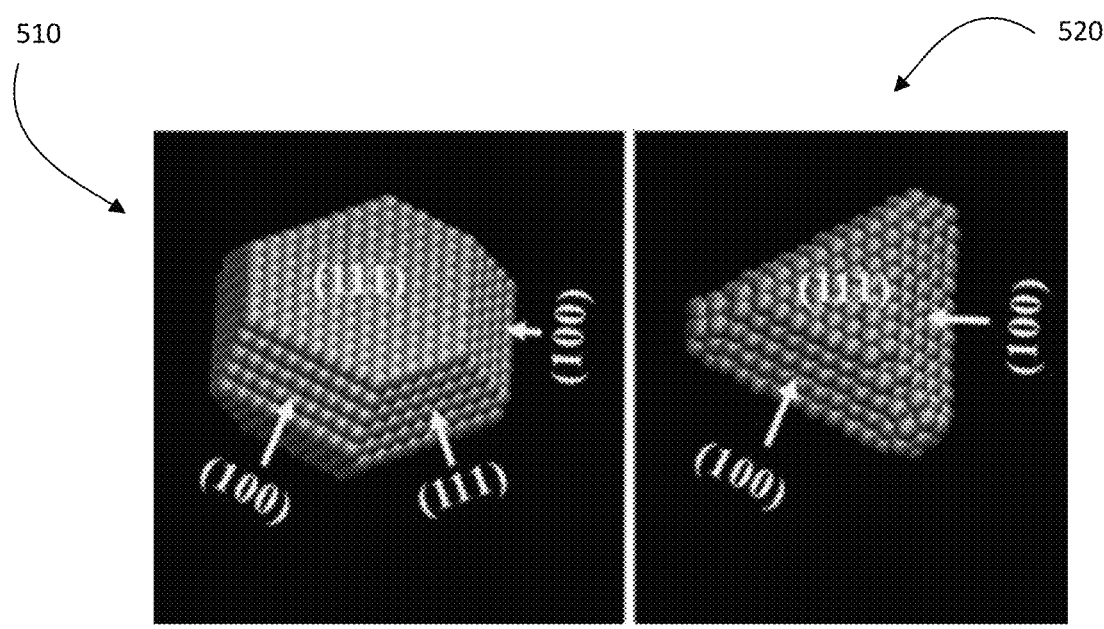
FIG. 4B is a schematic representation of an example three-dimensional hexagonal nanoplate.
FIG. 4C is a schematic representation of an example three-dimensional triangular nanoplate.

Reference will now be to FIGS. 4A to 4C. Each of FIGS. 4A to 4C shows an example configuration of a metal nanostrand.

FIG. 4A schematically illustrates a one-dimensional metal nanostrand 400 formed by lateral joining the hexagonal nanoplates 410 and triangular nanoplates 420. FIG. 4B shows an example three-dimensional hexagonal nanoplate 510 and FIG. 4C shows an example three-dimensional triangular nanoplate 520. The shape of the metal nanostrand 400, and the lateral joining of nanoplates 410, 420 can result from method 100.

FIGS. 4B and 4C show that the respective hexagonal nanoplate 510 and triangular nanoplate 520 has a top surface and a bottom surface (not shown). The top and bottom surfaces can be substantially planar. At both the top and bottom surfaces are arranged a (111) crystal plane. Along the side surfaces are arranged (100) crystal planes. During lateral joining, the nanoplates can adhere together along the (100) crystal planes The configuration of the triangular and hexagonal nanoplates 410, 420 illustrated in the metal nanostrand 400 is only shown herein by example and should not limit the possible configurations of the nanostrand 400. Other configurations of the triangular 420 nanoplates and/or hexagonal nanoplates 410 are possible. For example, metal nanostrand 400 can be formed of only hexagonal nanoplates 410 or only triangular nanoplates 420. Triangular nanoplates 420 can result from a growth of the hexagonal nanoplates 410 during synthesis 118, in some embodiments. Also, the configuration of the hexagonal and triangular nanoplates 410, 420 may be affected by various factors, such as the ratio of chemicals in the solutions 108, 116.

In some embodiments, metal nanostrands 200 and 210 may be infused into a suitable ink media, such as a paste or a liquid medium. The infused nanostrands 200, 210 can then be applied to a target substrate via, for example printing, and optionally screen printing, Mayer rod, or spray printing processes.

For example, to prepare the ink, the metal nanostrands 200, 210 may be transferred to a water based, or non-aqueous media with proper viscosity and surface tension to provide suitable ink. The methods of preparing the ink are those which are well-known in the art.

The ink or paste that includes the metal nanostrands can then be employed for applying the metal nanostrands to a substrate. For example, printing on a substrate with a nanostrand impregnated ink may be used to form electronic circuits on a transparent or non-transparent, flexible or rigid substrate.

In some embodiments, the metal nanostrands 200, 210 can help facilitate the use of a solution-based printed electronic and roll-to-roll technology, which may help reduce the overall cost for mass production of transparent conducting films.

Figure 5:
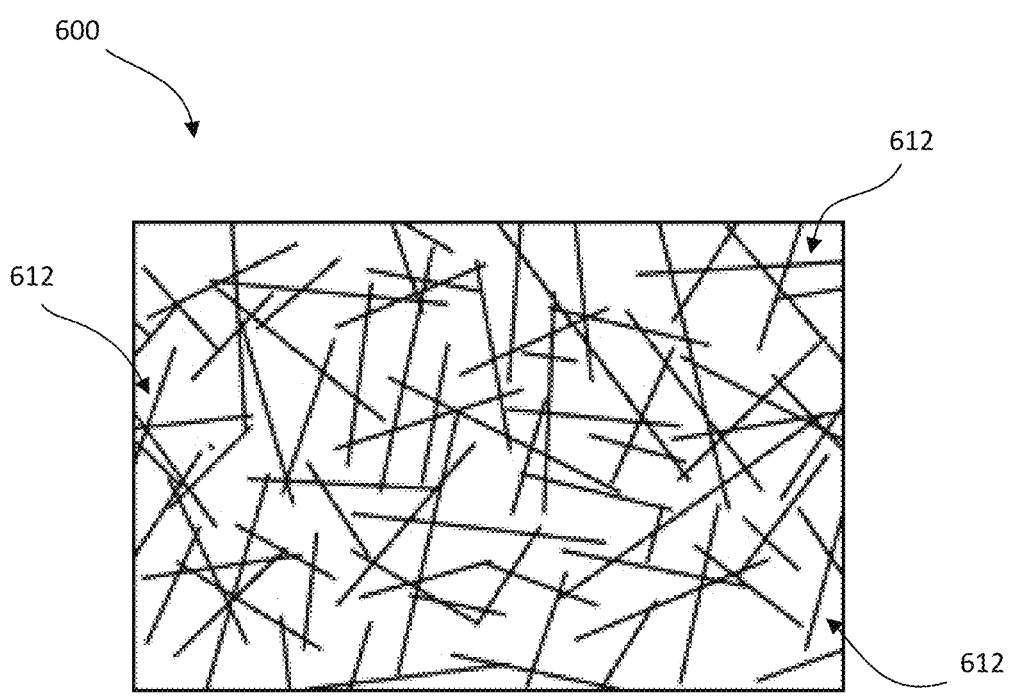
FIG. 5 is an enlarged view of an example mesh network of nanostrands formed in accordance with an example embodiment.

The metal nanostrands 200, 210, when applied to a target substrate, can be arranged in a random and/or orderly matrix array. The array can have a pattern or configuration. The arrangement can define the optical transmission and transparency properties, including but not limited to, when used for application in sensor, transparent heaters, touch sensors, solar cells, smart windows, and displays. The specific arrangement of nanostrands varies, at least, with the particular substrate coating technique. For example, FIG. 5 shows an example arrangement 600 of metal nanostrands 612 on a target substrate.

In some embodiments, the metal nanostrands 200 deposited on the substrate surface may form a transparent conductive layer.

The areal density of the transparent conductive layer can be varied to achieve certain conductivity, sheet resistance, and transparency properties. The areal density may be defined as the percent coverage of the surface of a substrate with metal nanostrands.

The surface resistivity of the transparent conductive layer may also be varied by adjusting the amount of metal nanostrands deposited on the substrate surface. For example, the transparent conductive layer may have a surface resistivity within the range of 0.00001 ohms/square or higher, such as, for example, to 1000 ohms/square.

The transparent conductive layer may be subjected to post processing treatment to improve its electrical conductivity. This post processing process may include heating and pressing the nanostrands mesh. For example, the nanostrand mesh may be heated at temperatures between 30° C. to 250° C. for a heating period that may last between about 1 minute or more, such as, for example, to about 3 hours. The process may optionally include applying a mechanical pressure to the nanostrands to help fuse overlapping junctions into a flexible nanostrand mesh. For example, a heat and roller may be used to heat and apply pressure to the nanostrand mesh. The mechanical pressure may be applied while the nanostrand mesh is at room temperature and/or while the nanostrand mesh is held at the relatively high temperature.

The thickness of the transparent conductive film may be any suitable thickness for a given application, and optionally may be between about 50 nm to 1 mm. In some embodiments, the thickness may be between 100 nm or more, such as up to 1000 nm. For example, with this thickness, the conductive layer can be applied to many application fields such as displays, touch panels, film heaters, thin cell photovoltaics, and smart glasses, and conductive trace in flexible or nonflexible printed circuit boards. The thickness varies with the amount of deposited material and pressing as post-processing.

In some embodiments, the transparent conductive layer may have an optical transparency of 0 to 99% for the UV to visible light (400 nanometers to 700 nanometers) and infrared wavelength region.

The transparent conductive layer may demonstrate user-defined variations in electromagnetic radiation transmission (e.g. optical light) through the mesh nanostrand matrix, ranging from opacity (0% electromagnetic radiation transmission through the film) to transparent (above 90% electromagnetic radiation transmission through the film), based upon the wavelength of the electromagnetic radiation (e.g. visible light, 400 nanometers to 700 nanometers). For example, more metal nanostrands on the surface of a substrate will correlate to more blocked light, and less transparency.

The transparent conductive layer, in some embodiments, can be integrated into electronic devices including, but not limited to, solar cells, displays, smartphones, touch screen panel, photodetectors, smart windows (e.g. used in conjunction with glass), transparent heaters, tactile sensors, environmental sensors, chemical sensors, photoelectric transduction systems, energy harvesting systems, and electromagnetic shielding film.

The metal nanostrands 200 may be applied to a flexible or non-flexible substrate by various methods such as, screen printing, inkjet printing, drop casting, spray coating, and roll casting.

In comparison with existing metal nanowires, the conductive nanostrands disclosed herein can have improved thermal stability (e.g., working at higher temperatures without degradation), electrical stability (e.g., working at higher current density), and improved shelf life.

It will be appreciated that for simplicity and clarity of illustration, where considered appropriate, reference numerals may be repeated among the figures to indicate corresponding or analogues elements or steps. In addition, numerous specific details are described herein in order to provide a thorough understanding of the example embodiments described herein. However, it will be understood by those of ordinary skills in the art that the embodiments described herein may be practiced without these specific details. In other instances, well-known methods, procedures and components have not been described in detail so as not to obscure the description of the embodiments. Furthermore, it should be noted that this description is not intended to limit the scope of the embodiments described herein, but rather as merely describing one or more example implementations. Various modifications and variations may be made to these example embodiments without departing from the spirit and scope of the invention.

The invention claimed is:

1. A metal nanostrand comprising:
a plurality of nanoplates joined laterally along a strand axis, the nanostrand having an axial length defined along the strand axis and an axial width defined along an axis orthogonal to the strand axis, wherein the ratio of the axial length to the axial width is at least a magnitude of ten,
wherein each of the plurality of nanoplates comprises a top surface, a bottom surface and one or more side surfaces laterally extending from the top surface to the bottom surface, and wherein,
a (111) crystallographic plane is arranged at each of the top surface and the bottom surface, and
a (100) crystallographic plane is arranged along at least one of the one or more side surfaces, and the lateral joining between nanoplates occurs along the (100) crystallographic plane, and
wherein the plurality of nanoplates comprises a nanoplate characterized by a hexagonal shape and a nanoplate characterized by a triangular shape.

2. The metal nanostrand of claim 1, wherein the axial length is within a range from approximately 1 microns to approximately 2000 microns.

3. The metal nanostrand of claim 1, wherein the axial width is within a range from approximately 50 nanometers to approximately 500 nanometers.

4. The metal nanostrand of claim 1, having a thickness within a range from approximately 10 nm to approximately 100 nm.

5. The metal nanostrand of claim 1, wherein the plurality of nanoplates comprises a first plurality of nanoplates, and the metal nanostrand comprises a main trunk portion formed from the lateral joining of the first plurality of nanoplates, and the metal nanostrand further comprises one or more branches, each branch formed of the lateral joining of a second plurality of nanoplates, and wherein each of the one or more branches extends away from the main trunk portion.

6. The metal nanostrand of claim 5, wherein the number of branches in the metal nanostrand is inversely related to the porosity of the metal nanostrand.

7. The metal nanostrand of claim 1, wherein the metal nanostrand is infused into an ink media along with a plurality of other metal nanostrands.

8. A nanostrand mesh formed of two or more metal nanostrands of claim 1, wherein the two or more metal nanostrands overlap at least an adjacent metal nanostrand.

9. The nanostrand mesh of claim 8, wherein the two or more metal nanostrands are randomly oriented with respect to each other.

10. The nanostrand mesh of claim 8, wherein the two or more metal nanostrands are aligned along a target direction.

11. The nanostrand mesh of claim 8, having a thickness in a range of approximately 100 nm to approximately 1000 nm.

12. The nanostrand mesh of claim 8, wherein the two or more metal nanostrands are welded to the at least adjacent metal nanostrand at the point of overlap.

13. A metal nanostrand comprising:
a main trunk portion formed from the lateral joining of a first plurality of nanoplates, and
one or more branches, each branch formed of the lateral joining of a second plurality of nanoplates, and wherein each of the one or more branches extends away from the main trunk portion,
wherein each of the nanoplates comprises a top surface, a bottom surface and one or more side surfaces laterally extending from the top surface to the bottom surface, and wherein a (111) crystallographic plane is arranged at each of the top surface and the bottom surface and wherein the number of branches in the metal nanostrand is inversely related to the porosity of the metal nanostrand, whereby a smaller number of branches increases the porosity of the metal nanostrand and a larger number of branches decreases the porosity of the metal nanostrand.

14. The metal nanostrand of claim 13, wherein each of the nanoplates further comprises a (100) crystallographic plane arranged along at least one of the one or more side surfaces, and the lateral joining between nanoplates occurs along the (100) crystallographic plane.

15. The metal nanostrand of claim 13, wherein the first plurality of nanoplates extend along a strand axis, and the main trunk portion has an axial length defined along the strand axis and an axial width defined along an axis orthogonal to the strand axis.

16. The metal nanostrand of claim 15, wherein the ratio of the axial length to the axial width is at least a magnitude of ten.

17. The metal nanostrand of claim 15, wherein the axial length of the main trunk portion is within a range from approximately 1 microns to approximately 2000 microns.

18. The metal nanostrand of claim 15, wherein the axial width of the main trunk portion is within a range from approximately 50 nanometers to approximately 500 nanometers.

19. The metal nanostrand of claim 13, having a thickness within a range from approximately 10 nm to approximately 100 nm.

20. The metal nanostrand of claim 13, wherein one or more of the first and second plurality of nanoplates has one of a hexagonal shape and a triangular shape.

21. The metal nanostrand of claim 13, wherein the metal nanostrand is infused into an ink media along with a plurality of other metal nanostrands.

* * * * *